(12) United States Patent
Zagoskin et al.

(10) Patent No.: US 6,504,172 B2
(45) Date of Patent: Jan. 7, 2003

(54) SUPERCONDUCTING DOT/ANTI-DOT FLUX QUBIT BASED ON TIME-REVERSAL SYMMETRY BREAKING EFFECTS

(75) Inventors: Alexandre M. Zagoskin; Geordie Rose; Mohammad H. S. Amin; Marcel Franz; Jeremy P. Hilton, all of Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 0 days.

(21) Appl. No.: 09/810,818

(22) Filed: Mar. 16, 2001

(65) Prior Publication Data

US 2002/0130315 A1 Sep. 19, 2002

(51) Int. Cl.$^7$ .............................................. H01L 29/06
(52) U.S. Cl. ............................. 257/14; 257/17; 257/21; 257/432
(58) Field of Search ........................... 257/17, 21, 432; 355/18; 348/222

(56) References Cited

U.S. PATENT DOCUMENTS

| | | | |
|---|---|---|---|
| 5,157,466 A | 10/1992 | Char et al. ...................... 357/5 |
| 5,274,249 A | 12/1993 | Xi et al. ........................ 257/39 |
| 5,560,836 A | 10/1996 | Nagaishi ........................ 216/3 |
| 5,571,778 A | 11/1996 | Fujimoto et al. ........... 505/329 |
| 6,016,433 A | 9/1997 | Mizuno et al. .............. 505/190 |
| 5,694,059 A | 12/1997 | Wada et al. .................. 326/62 |
| 5,710,051 A | 1/1998 | Park et al. ................... 438/149 |
| 5,767,043 A | 6/1998 | Cantor et al. ............... 505/162 |
| 5,768,297 A | 6/1998 | Shor ...................... 371/40.11 |
| 5,793,091 A | * 8/1998 | Devoe ......................... 257/432 |
| 5,838,021 A | 11/1998 | Ancona ......................... 257/30 |
| 5,844,279 A | 12/1998 | Tanamoto et al. ............. 257/347 |
| 5,883,051 A | 3/1999 | Ishimaru et al. ............. 505/190 |
| 5,917,322 A | 6/1999 | Gershenfeld et al. ........ 324/307 |
| 5,997,958 A | 12/1999 | Sato et al. ................... 427/468 |
| 6,010,934 A | 1/2000 | Wu .............................. 438/264 |
| 6,060,723 A | 5/2000 | Nakazato et al. .............. 257/20 |
| 6,069,380 A | 5/2000 | Chou et al. .................. 257/315 |
| 6,169,308 B1 | 1/2001 | Sunami et al. ............... 257/321 |
| 6,204,517 B1 | 3/2001 | Wu .............................. 257/51 |
| 6,211,013 B1 | 4/2001 | Park et al. ................... 438/257 |
| 6,301,029 B1 | 10/2001 | Azuma ........................ 359/107 |
| 6,317,192 B1 | * 11/2001 | Silverbrook et al. .......... 355/18 |
| 6,317,766 B1 | 11/2001 | Grover ........................ 708/400 |

OTHER PUBLICATIONS

D.F. Agterberg, et al., "Vortex lattice structures and pairing symmetry in Sr2RuO4", LANL preprint cond–mat/0001421(2000).

(List continued on next page.)

*Primary Examiner*—David Nelms
*Assistant Examiner*—Mai-Huong Tran
(74) *Attorney, Agent, or Firm*—Pennie & Edmonds LLP

(57) ABSTRACT

A solid-state quantum computing structure includes a dot of superconductive material, where the superconductor possesses a dominant order parameter with a non-zero angular momentum and a sub-dominant order parameter that can have any pairing symmetry. Alternately a solid-state quantum computing structure includes an anti-dot, which is a region in a superconductor where the order parameter is suppressed. In either embodiment of the invention, circulating persistent currents are generated via time-reversal symmetry breaking effects in the boundaries between superconducting and insulating materials. These effects cause the ground state for the supercurrent circulating near the qubit to be doubly degenerate, with two supercurrent ground states having distinct magnetic moments. These quantum states of the supercurrents store quantum information, which creates the basis of qubits for quantum computing. Writing to the qubits and universal single qubit operations may be performed via the application of magnetic fields. Read-out of the information may be performed using a SQUID microscope or a magnetic force microscope.

24 Claims, 11 Drawing Sheets-

OTHER PUBLICATIONS

Y. Aharonov and D. Bohm, "Significance of Electromagnetic Potentials in the Quantum Theory", Phys. Rev. 115, 485–491 (1959).

Alexander Altland and Martin R. Zimbauer, "Nonstandard symmetry classes in mesoscopic normal–superconducting hybrid structures", Phys. Rev. B 55, 1142–1161 (1997).

M. Amin et al., "Mechanisms of Spontaneous Current Generation in an Inhomogeneous d–wave Superconductor", LANL, cond–mat/0011416v, 1–4 (Dec. 6, 2000).

A. Andreev, "Superfluidity, superconductivity and magnetism in mesoscopics", Physics –Uspeskhi, 41, 581–588 (Jan. 1, 1998).

D. Averin, "Quantum computing and quantum measurement with mesoscopic Josephson junctions", LANL preprint quant–ph/0008114 (2000).

D. Averin et al., "Macroscopic Resonant tunneling of magnetic flux", Physical Review B, 62, 11802–11811 (Nov. 1, 2000).

B Baelus et al., "Vortex states in superconducting rings", Physical Review B, 61, 9734–9747 (Apr. 1, 2000),.

Adriano Barenco, "Quantum Physics and Computers", LANL, quant–ph/961201v2, –(Dec. 3, 1996),.

Alexandre Blais, and Alexandre Zagoskin, "Operation of universal gates in a solid state quantum computer based on clean Josephson junction between d–wave superconductors", LANL, quant–ph/9905043, 1–4 (Apr. 7, 2000).

G. Blatter, "Engineering Superconducting Phase Qubits", LANL preprint cond–mat/9912163 (1999).

Mark Bocko et al., "Prospects for Quantum Coherent Computation Using Superconducting Electronics", IEEE Transactions on Applied Superconductivity, 7(2), 3638–3641 (Jun., 1997).

I. Bonalde, B. D. Yanoff, M. B. Salamon, D. J. Van Harlingen, E. M. E. Chia, Z. Q. Mao, Y. Maeno, "Temperature Dependence of the Penetration Depth in Sr2RuO4: Evidence for Nodes in the Gap Function," Phys. Rev. Letters, Nov. 27, 2000, vol. 85, No. 22.

H.J. Briegel et al., LANL preprint quant–ph/9803056 (1998).

C. Bruder et al., "Tunnel junctions of unconventional superconductors", Physical Review B, 51, 12904–12907 ( 1995 ),.

R. Camps et al., "Microstructure and critical current of superconducting YBa2Cu3O7–x", Nature, 239, 229–232 (1987).

P. Chaudhari and Shawn–Yu Lin, "Symmetry of the superconducting order parameter in a YBa2Cu3O7 –delta epitaxial films", Phys. Rev. Lett. 72, 1084–1087 (1994).

P. Chaudhari et al., "The Microstructure of High–Critical Current Superconducting Films", Science, 238:4825, 342–344 (1987).

J. Cirac, and P. Zoller, "A scalable quantum computer with ions in an array of microtraps", Letters to nature, 404, 579 (Apr. 6, 2000).

H. Darhmaoui, and J Jung, "Coherent Josephson nanostructures and the dissipation of the persistent current in the a–b planes of YBa2Cu3O7 thin films", Physical Review B, 57, 8009–8025 (Apr. 1, 1998),.

R.S. Decca, H. D. Drew, E. Osquiguil, B. Maiorov, J. Guimpel, "Anomalous Proximity Effect in Underdoped YBaCuO Josephson Junctions," Phys. Rev. Lett. 85, 3708 (2000).

Jacek Dziarmaga, "Spin Environment Engineering for a Persistent Current Qubit", LANL, condmat/101454, 1–4 (Jan. 30, 2001),.

A. Erb, E. Walker, and R. Flukiger, Physica C 245, 245 (1995).

Matthias Eschrig, "Distribution functions in nonequilibrium theory of superconductivity and Andreev spectroscopy in unconventional superconductors", Physical Review B, 61, 9061 (Apr. 1, 2000).

Daniel Esteve, Michel H. Devoret, and John M. Martinis, "Effect of an arbitrary dissipative circuit on the quantum energy levels and tunneling of a Josephson junction", Phys. Rev. B 34, 158–163 (1986).

R. Feynman, Int. J. Theor. Phys., 21, 467–488 (1982).

M. Fogelstrom, and S Yip, "Time–reversal symmetry–breaking states near grain boundaries between d–wave superconductors", Physical Review B, 57, R14060 (No DoR),.

Jonathon Friedman et al., "Quantum superposition of distinct macroscopic states", Nature, 406, 43–46 (Jul. 6, 2000).

Haranath Ghosh, "Time–reversal symmetry–breaking superconductivity", Physical Review B, 59, 3357–3360 (Feb. 1, 1999).

A. Golubov, and M Kupriyanov, "Anomalous proximity effect in d–wave superconductors", LANL, cond–mat9803369, 1–6 (Mar. 30, 1998).

A. Golubov, and M Kupriyanov, "Surface electronic scattering in d–wve superconductors", LANL, cond–mat/9901318, 1–4 (Jan. 27, 1999),.

Hermann Grabert, Gert–Ludwig Ingold, "Mesoscopic Josephson Effect", Superlattices and Microstructures 25:5/6, pp. 915–923, [aslo published as LANL preprint cond–mat/9811194] (1999).

M.J. Graf et al., "Local Time–Reversal Symmetry Breaking in dx2–y2 Superconductors", LANL, cond–mat/9907300, 1–4 (Jul. 20, 1999),.

M.J. Graf, A.V. Balatsky, "Identifying the pairing symmetry in the Sr2RuO4 superconductor", LANL preprint cond–mat/0005546 (2000).

L. Grover, Proc. 28th STOC, 212–219 (1996).

R. H. Heffner, D. E. MacLaughlin, J. E. Sonier, G. J. Nieuwenhuys, O. O. Bernal, Barbara Simovic, P.G. Pagliuso, J. L. Sarrao, and J. D. Thompson, "Time–Reversal––Symmetry Violation and Coexistence of Superconducting and Magnetic Order in CeRh1–xlrxln5,".

H. Hilgenkamp and J. Mannhart, "Superconducting and normal–state properties of YBa2Cu3O7 bicrystal grain boundary junctions in thin films", Applied Physics Letters 73:2, pp. 265–267 (1998).

J. Hogan–O'Neill et al., "Tilt grain–boundary effects in s–and d–wave superconductors", Physical Review B, 60, 3568–3571 (Aug. 1, 1999).

A. Huck et al., "Time–reversal symmetry breaking and spontaneous currents in s–wave/normal–metal/d–wave superconductor Sandwiches", Phys. Rev. B, 56:21, 14163–14167 (Dec. 1, 1997).

M. Hurd et al., "ac Josephson effect in d–wave junctions", Phys. Rev. B., 59:6, 4412–4426 (Feb. 1, 1999).

E. Ilichev et al., "Degenerate ground state in a mesoscopic YBa2Cu3O7–x grain boundary Josephson junction", LANL, cond–mat/0102404, 1–4 (Feb. 23 2001),.

E. Il'ichev, V. Zakosarenko, R. P. J. Ijsselsteijn, H.E. Hoenig, V. Schultze, H. –G. Meyer, M. Grajcar and R. Hlubina, "Anomalous Periodicity of the Current–Phase Relationship of Grain–Boundary Josephson Junctions in High–Tc Superconductors", Phys. Rev. B. 60 p. 3096 (1999).

L.B. Ioffe, V.B. Geshkenbein, M.V. Feigelman, A.L. Fauchere, G. Blatter, "Quiet SDS Josephson Junctions for Quantum Computing", LANL preprint cond–mat/9809116 (1998).

Lev Ioffe et al., "Environmentally decoupled sds–wave Josephson junctions for quantum computing", Letters to nature, 398, 679 (Apr. 22, 1999).

A. Jayannavar, and P. Singha Deo, "Persistent currents in the presence of a transport current", Physical Review B, 51, 10175 (Apr. 15, 1995).

J. A. Jones, M. Mosca, and R. H. Hansen, "Implementation of a quantum search algorithm on a quantum computer," Nature, 393:344–346, (1998).

A. Kitaev, LANL preprint quant–ph/9511026 (1995).

E. Knill, R. Laflamme, and W. Zurek, Science, 279, p. 342 (1998).

D. Koelle et al., "High–transition–temperature superconducting quantum interference devices", Review of Modern Physics, 71, 631–686 (Apr. 3, 1999).

J. Kolacek et al., "Charge Profile in Vortices", Physical Review Letters, 86, 312–315 (Jan. 8, 2001).

Vladimir Krasnov et al., "Intrinsic tunneling spectroscopy in small Bi2212 mesas", ETMS Gothenburg Aug. 12–15, 1999 (1999).

Lachenmann, S. et al., "Charge transport in superconductor/semiconductor/normal–conductor step junctions", Phys. Rev. B, 56:21, 14108–14115 (Dec. 1, 1997).

A. Leggett et al., "Dynamics of the dissipative two–state system", Review of Modern Physics, 59, 1–85 (Jan. 1, 1967).

R. Liang, D.A. Bonn, and W.N. Hardy, Physica C 304, 105 (1998).

T. Lofwander et al., "Time–reversal symmetry breaking at Josephson tunnel junctions of purely d–wave superconductors", Physical Review B, 62, R14653–14656 (Dec. 1, 2000).

G.M. Luke, Y. Fudamoto, K.M. Kojima, M.I. Larkin, J. Merrin, B. Nachumi, Y.J. Uemura, Y. Maeno, Z.Q. Mao, Y. Mori, H. Nakamura, M. Sigrist, "Time–Reversal Symmetry Breaking Superconductivity in Sr2RuO4", LANL preprint cond–mat/9808159 (1998).

Yuriy Makhlin et al., "Quantum state engineering with Josephson–junction devices", submitted to Reviews of Modern Physics, cond–mat/0011269, 1–46 (Nov. 15, 2000).

Yuriy Makhlin, Gerd Schoen, Alexander Shnirman, "Nano–electronic Realizations of Quantum BIts", LANL preprint cond–mat/9912405 (1999).

Yuriy Makhlin, Gerd Schoen, Alexander Shnirman, "Josephson–Junction Qubits with Controlled Couplings", LANL preprint cond–mat/9808067 (1998).

M. Matsumoto, and M. Sigrist, "Quasiparticle States near the Surface and the Domain Wall in a px±ipy–Wave Superconductor", LANL preprint cond–mat/9902265 v2, (1999).

A. J. Millis, "Josephson coupling between a disk of one superconductor and a surrounding superconducting film of different symmetry", Phys. Rev. B 49, 15408–15411 (1994).

K. A. Moler et al., "Magnetic Flux Distrabution in Grain Boundary and Twin Boundaries in YBCO", pp. 232–235 in Proceedings of the 10th Aniversary HTS Workshop, edited by B. Batlogg et al. World Scientific, Singapore (1997).

J. E. Mooij et al., "Josephson Persistent–Current Qubit", Science Mag, 285, 1036 (Aug. 13, 1999).

Y. Nakamura; Yu, A. Pashkin and J. S. Tsai, "Coherent Control Of Macroscopic Quantum States In a Single–Cooper–Pair Box," Nature vol. 398 No. 6730 pp. 786–788 (1999).

Y. Nakamura et al. "Singularity–matching peaks in a superconducting single–electron transistor", Physical Review B 56, 5116–5119 (1997).

S. Nicoletti et al., "Bi–epitaxial YBCO grain boundary Josephson Junctions on SrTiO3 and sapphire substrates", Physica C, 269, 255–267 (1996).

T. Orlando et al., "Superconducting persistent–current qubit", Physical Review B, 60, 15398–15413 (Feb. 1, 1999).

P. Pingue et al., "Fabrication of hybrid superconductor–semiconductor nanostructures by integrated ultraviolet–atomic force microscope lithography", JVST B, 15, 1398–1401 (1997).

Z. Radovic et al., "Spontaneous currents in Josephson devices", Physical Review B, 60, 6844 (Sep. 1, 1999).

D. Rainer et al., "Andreev Bound States, Surfaves and Subdominat Pairing in High Tc Superconductors", Proceedings of Spectoscopies of Novel Superconductors, LANL preprint cond–mat/9712234 (Sep. 14, 1997).

G. Rose, "AC Relaxation in the Fe8 Molecular Magnet," Chapters 4&5, Ph.D. Thesis, University of British Columbia, Department of Physics and Astronomy, (2000).

V.A. Schweigert & F.M. Peeters, "Flux Penetration and Expulsion in Thin Superconducting Disks", Physical Review Letters 83:12, pp. 2409–2412, (1999).

V.A. Schweigert, F.M. Peeters, and P. SinghaDeo, "Vortex Phase Diagram for Mesoscopic Superconducting Disks", Physical Review Letters 81:13, pp. 2783–2786 (1998).

P. Shor, SIAM J. of Comput., 26:5, 1484–1509 (1997).

A. Shnirman et al., "Quantum Measurement with a Single Electron Transistor", Physical Review B 57:24, 15400–15407 (1998).

M. Sigrist et al., "Fractional Vortices as Evidence of Time–Reversal Symmetry Breaking in High–Temperature Superconductors", Phys. Rev. Lett., 74:16, 3249–3252 (Apr. 17, 1995).

M. Sigrist & T. M. Rice, "Symmerty Classification of States in High Temperature Superconductors", Zeitschrift fur Physik B 68, pp. 9–14 (1987).

F. Tafuri, et al., "Feasibility of biepitaxial YBaCuO –Josephson junctions for fundamental studies and potential curcuit implementation", Phys. Rev. B, 62:21, 14431–14438 (Dec. 1, 2000).

F. Tafuri, and J Kirtley, "Spontaneous magnetic moments in YBa2Cu307 thin films", Physical Review B, 62, 13934–13937 (Dec. 1, 2000).

Lin Tian, L.S. Levitov, Caspar H. van der Wal, J.E. Mooij, T. P. Orlando, S. Lloyd, C. J. P. M. Harmans, J.J. Mazo, "Decoherence of the Superconducting Persistent Current Qubit", LANL preprint cond–mat/9910062 (1999).

C. C. Tsuei, and J Kirtley, "Pairing symmetry in cuprate superconductors", Reviews of Modern Physics, 72, 969–1016 (Oct. 4, 2000).

C. C. Tsuei, J. R. Kirtley, C. C. Chi, Lock See Yu–Jahnes, A. Gupta, T. Shaw, J. Z. Sun, and M. B. Ketchen, "Pairing Symmetry and Flux Quantization in a Tricrystal Superconducting Ring of YBa2Cu3O7 –delta", Physical Review Letters 73, 593–596 (1994).

Caspar H. van der Wal et al., "Josepshon Persistent Current Qubit and Quantum Flux Measurements", Electron Trnsport in Mesoscopic Systems Conference, Gothenberg, Sweden, (Aug. 12, 1999).

Author Unknown, [Entry on] "Mesoscopic Physics", McGraw Hill Encyclopedia 8Ed, vol. 10 p. 722 (1998).

Lieven M.K. Vandersypen, Matthias Steffen, Gregory Breyta, Costantino S. Yannoni, Richard Cleve and Isaac L. Chuang, "Experimental Realization Of Order–Finding With A Quantum Computer," LANL preprint quant–ph/0007017 (2000).

A. Wallraff et al., "Fluxons in long josephson junctions of sub–micron width", Electron Transport in Mesoscopic Systems Conference, Gothenberg, Sweden, (Aug. 12, 1999).

P. D. Ye, L. W. Engel, D. C. Tsui, J. A. Simmons, J. R. Wendt, G. A. Vawter, J. L. Reno, "High Magnetic Field Microwave Conductivity of 2D Electrons in an Array of Antidot" LANL preprint cond–mat/0103127 (2001).

S. Yip, and J. Sauls, "Nonlinear Meissner Effect in CuO Superconductors", Phys. Rev. Lett., 69:15, 2264–2267 (Oct. 12, 1992).

S. Yip, "Josephson current–phase relationships with unconventional superconductors", Phys. Rev. B, 52:5, 3087–3090 (Aug. 1, 1995).

Alexandre M. Zagoskin, "A scalable tunable qubit based on a clean DND or grain boundary D–D junction", LANL preprint cond–mat/9903170 (1999).

Alexandre Zagoskin and Masaki Oshikawa, "Spontaneous Magnetic Flux and Quantum Noise in a Doubly Connected Mesoscopic SND Junction", LANL cond–mat/9710260, (Oct. 23, 1997).

Jian–Xin Zhu, and C Ting, "Spontaneous flux in a d–wave superconductor with time–reversal–symmetry–broken pairing state at (110)–oriented boundaries", Physical Review B, 60, 3739–3742 (1999).

Zhu, Jian–Xin et al., "Bound states and Josephson current in mesoscopic s–wave superconductor–normal metal–d–wave superconductor junctions", Phys. Rev. B, 54:10, 7354–7359 (Sep. 1, 1996).

* cited by examiner

SUPERCONDUCTING DOT/ANTI-DOT FLUX QUBIT BASED ON TIME-REVERSAL SYMMETRY BREAKING EFFECTS

BACKGROUND

1. Field of the Invention

This invention relates to quantum computing and to solid state devices that use superconductive materials to create and maintain coherent quantum states such as required for quantum computing.

2. Description of Related Art

Research on what is now called quantum computing traces back to Richard Feynman. See R. Feynman, Int. J. Theor. Phys., 21, 467–488 (1982). Feynman noted that quantum systems are inherently difficult to simulate with conventional computers but that observing the evolution of a quantum system could provide a much faster way to solve some computational problems. In particular, solving a theory for the behavior of a quantum system commonly involves solving a differential equation related to the Hamiltonian of the quantum system. Observing the behavior of the quantum system provides information regarding the solutions to the equation.

Further efforts in quantum computing were initially concentrated on "software development" or building of the formal theory of quantum computing. Milestones in these efforts were the discoveries of the Shor and Grover algorithms. See P. Shor, SIAM J. of Comput., 26:5, 1484_14 1509 (1997); L. Grover, Proc. 28th STOC, 212–219 (1996); and A. Kitaev, LANL preprint quant-pb/9511026 (1995). In particular, the Shor algorithm permits a quantum computer to factorize natural numbers. Showing that fault-tolerant quantum computation is theoretically possible opened the way for attempts at practical realizations of quantum computers. See E. Knill, R. Laflamme, and W. Zurek, Science, 279, p. 342 (1998).

In such an application, a quantum computer could render obsolete all existing encryption schemes that use the "public key" method. In another application, quantum computers (or even a smaller scale device, a quantum repeater) could enable absolutely safe communication channels, where a message, in principle, cannot be intercepted without being destroyed in the process. See H. J. Briegel et al., LANL preprint quantph/9803056 (1998) and the references therein.

Quantum computing generally involves initializing the states of N qubits (quantum bits), creating controlled entanglements among the N qubits, allowing the quantum states of the qubits to evolve under the influence of the entanglements, and reading the qubits after they have evolved. A qubit is conventionally a system having two degenerate quantum states, and the state of the qubit can have non-zero probability of being found in either degenerate state. Thus, N qubits can define an initial state that is a combination of $2^N$ states. The entanglements control the evolution of the distinguishable quantum states and define calculations that the evolution of the quantum states performs. This evolution, in effect, can perform $2^N$ simultaneous calculations. Reading the qubits after evolution is complete determines the states of the qubits and the results of the calculations.

Several physical systems have been proposed for the qubits in a quantum computer. One system uses chemicals having degenerate nuclear spin states. Nuclear magnetic resonance (NMR) techniques can read the spin states. These systems have successfully implemented a search algorithm and a number-ordering algorithm. See M. Mosca, R. H. Hansen, and J. A. Jones, "Implementation of a quantum search algorithm on a quantum computer," *Nature*, 393:344–346, 1998 and Lieven M. K. Vandersypen, Matthias Steffen, Gregory Breyta, Costantino S. Yannoni, Richard Cleve and Isaac L. Chuang, "Experimental Realization Of Order-Finding With A Quantum Computer," LANL preprint quant-pb/0007017 (2000) and the references therein. These search processes are related to the quantum Fourier transform, an essential element of both Shor's algorithm for factoring of a natural number and Grover's Search Algorithm for searching unsorted databases. See T. F. Havel, S. S. Somaroo, C. -H. Tseng, and D. G. Cory, "Principles And Demonstrations Of Quantum Information Processing By NMR Spectroscopy," 2000 and the references therein, which are hereby incorporated by reference in their entirety. However, efforts to expand such systems up to a commercially useful number of qubits face difficult challenges.

Another physical system for implementing a qubit includes a superconducting reservoir, a superconducting island, and a dirty Josephson junction that can transmit a Cooper pair (of electrons) from the reservoir into the island. The island has two degenerate states. One state is electrically neutral, but the other state has an extra Cooper pair on the island. A problem with this system is that the charge of the island in the state having the extra Cooper pair causes long range electric interactions that interfere with the coherence of the state of the qubit. The electric interactions can force the island into a state that definitely has or lacks an extra Cooper pair. Accordingly, the electric interactions can end the evolution of the state before calculations are complete or qubits are read. This phenomenon is commonly referred to as collapsing the wavefunction, loss of coherence, or decoherence. See "Coherent Control Of Macroscopic Quantum States In A Single-Cooper-Pair Box," Y. Nakamura; Yu, A. Pashkin and J. S. Tsai, *Nature* Volume 398 Number 6730 Page 786–788 (1999) and the references therein.

Another physical system for implementing a qubit includes a radio frequency superconducting quantum interference device (RF-SQUID). See J. E. Mooij, T. P. Orlando, L. Levitov, Lin Tian, Caspar H. van der Wal, and Seth Lloyd, "Josephson Persistent-Current Qubit," *Science* Aug. 13, 1999; 285: 1036–1039, and the references therein, which are hereby incorporated by reference in their entirety. The RF-SQUID's energy levels correspond to differing amounts of magnetic flux threading the SQUID ring. Application of a static magnetic field normal to the SQUID ring may bring two of these energy levels, corresponding to different magnetic fluxes threading the ring, into resonance. Typically, external AC magnetic fields can also be applied to pump the system into excited states so as to maximize the tunneling frequency between qubit basis states. A problem with this system is that the basis states used are not naturally degenerate and the biasing field required has to be extremely precise. This biasing is possible for one qubit, but with several qubits, fine tuning this bias field becomes extremely difficult. Another problem is that the basis states used are typically not the ground states of the system, but higher energy states populated by external pumping. This requires the addition of an AC field-generating device, whose frequency will differ for each qubit as the individual qubit parameters vary.

Research is continuing and seeking a structure that implements a quantum computer having a sufficient number of qubits to perform useful calculations.

SUMMARY

In accordance with one embodiment of the invention, a qubit includes a dot formed of a superconductor having a pairing symmetry that contains a dominant component with non-zero angular momentum, and a sub-dominant component that can have any pairing symmetry. The high temperature superconductors $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$. are examples of superconductors that have non-zero angular momentum (dominant d-wave pairing symmetry), whereas the low temperature superconductor $Sr_2RuO_4$, or the heavy fermion material $CeIrIn_5$, are examples of p-wave superconductors that also have non-zero angular momentum.

In such qubits, persistent equilibrium currents arise near the outer boundary of the superconducting dot. These equilibrium currents have two degenerate ground states that are related by time-reversal symmetry. One of the ground states corresponds to persistent currents circulating in a clockwise fashion around the superconducting dot, while the other ground state corresponds to persistent currents circulating counter-clockwise around the dot. The circulating currents induce magnetic fluxes and therefore magnetic moments, which point in opposite directions according to the direction of current flow in the dot, and the magnetic moments may be used to distinguish the states of the qubit.

In accordance with another embodiment of the invention, a qubit includes a superconductive film or bulk superconductor, in which a region of the superconductive material has been removed or damaged. This region is sometimes referred to herein as an "anti-dot". The superconductive film or bulk surrounding the anti-dot or region of removed or damaged superconductor supports two degenerate ground states corresponding to equilibrium persistent currents circulating in clockwise and counter-clockwise directions around the anti-dot. These two states may be distinguished by the magnetic moments that they produce.

In accordance with yet another embodiment of the invention, a qubit includes a material such as $YBa_2Cu_3O_{7-x}$, which can undergo an insulating-superconducting transition and when in the insulating state can be locally turned superconducting through photon or particle irradiation. This material is prepared in the insulating state, for example, in the anti-ferromagnetic insulating state of $YBa_2Cu_3O_{7-x}$, which requires x to be strictly greater than 0.6, and strictly less than 1. This insulator is then irradiated, for example using scanning near field microscopy. The irradiation turns a region superconducting to create a superconducting dot or anti-dot in the parent insulator. This dot or anti-dot then gives rise to persistent equilibrium currents at the boundary between the superconducting area and the insulating background. These currents give rise to two nearly degenerate ground states, which correspond to clockwise and counter-clockwise current circulation around the dot or anti-dot. The magnetic moments created by these current flows distinguish the two degenerate states.

To write to (or initialize the state of) a dot or anti-dot qubit, a static magnetic field having a magnitude that depends on the qubit's structure, is applied normal to the plane of the qubit and in a direction chosen according to the desired basis state (|0> or |1>). The magnetic field breaks the energy degeneracy of the qubit states. With this bias, the qubit will decay to the most energetically favorable state (either |0> or |1> as required), with the time to decay typically being shorter than 1 millisecond but depending on the chosen embodiment of the invention.

To perform single qubit operations on a dot or anti-dot qubit, an external magnetic field applied to the qubit can be modulated. Application of a magnetic field in the plane of the qubit generates a term in the effective Hamiltonian of the form $\Delta(H_x)\hat{\sigma}_x$, where the tunneling matrix element $\Delta(H_x)$ between the states can be varied over a large range, typically from zero (for zero transverse field) to 100 GHz depending on the specific embodiment of the qubit. Applying a magnetic field normal to the plane of the qubit provides a term proportional to $\hat{\sigma}_z$.

To overcome the effects of tunneling and remain in a specific state, an alternating magnetic field B(t) normal to the qubit can be used. This has the effect of adding to the Hamiltonian a term proportional to $B(t)\hat{\sigma}_z$ where, for example, B(t) can be a square wave. This method is also used in conjunction with a clock whose frequency is an integer multiple of the square wave frequency (so that at every clock pulse, the qubit is in the same state in which it began).

To read from the qubit, any ultra-sensitive instrument that reads sub-fluxquantum level magnetic fields, such as a SQUID microscope or magnetic force microscope, can determine the direction of the magnetic flux and thereby read the supercurrent state associated with the dot or anti-dot.

In accordance with an embodiment of the invention, a quantum computing method cools a structure including a plurality of independent qubits to a temperature that makes the relevant systems superconducting and suppresses the decoherence processes in the system. After the structure is at the appropriate temperature, the method establishes a circulating supercurrent in each qubit in a quantum state that can be an admixture of a first state having a first magnetic moment and a second state having a second magnetic moment. The supercurrent in each qubit is a ground state current arising from use of a superconductor with a dominant order parameter having non-zero angular momentum and a subdominant order parameter having any pairing symmetry. Applying the magnetic bias fields normal to the plane of the qubits can set the state of the current. The quantum state evolves according to probabilities for tunneling between the two ground states in the presence of an externally applied magnetic field. Measuring a magnetic moment or flux due to the supercurrent generated by the qubit determines a result from the quantum evolution.

BRIEF DESCRIPTION OF THE DRAWINGS

Use of the same reference symbols in different figures indicates similar or identical items.

DETAILED DESCRIPTION

In accordance with an aspect of the invention, quantum computing uses qubits based on the degenerate ground states of the supercurrent that arises due to time-reversal symmetry breaking effects in superconductors. These effects occur, for example, in d-wave superconductors when the dominant order parameter symmetry in a superconductor is suppressed and the superconductor possesses a subdominant component. Furthermore, p-wave superconductors exhibit a double degeneracy in the pairing symmetry of the order parameters and thus exhibit similar yet less sensitive behavior to that of the d-wave superconductor. These effects in d-wave superconductors may occur at boundaries such as grain boundaries, (see U.S. patent application Ser. No. 09/452,749, entitled "Permanent Readout Superconducting Qubit" by A. M. Zagoskin, which is hereby incorporated by reference in its entirety) and at defects (see F. Tafuri and J. R. Kirtley, "Spontaneous Magnetic Moments in YBCO Thin Films," Phys. Rev. B 62, 13934 (2000) and the references cited therein, which are hereby incorporated by reference in their entirety). Furthermore, these effects may be seen in p-wave superconductors at boundaries similar to those for the d-wave superconductor (see Masashige Matsumoto and Manfred Sigrist, "Quasiparticle States near the Surface and the Domain Wall in a $p_x \pm i p_y$-Wave Superconductor," LANL preprint cond-mat/9902265 v2 (1999), and the references cited therein, and also R. H. Heffner, D. E. MacLaughlin, J. E. Sonier, G. J. Nieuwenhuys, O. O. Bernal, Barbara Simovic, P. G. Pagliuso, J. L. Sarrao, and J. D. Thompson, "Time-Reversal-Symmetry Violation and Coexistence of Superconducting and Magnetic Order in $CeRh_{1-x}Ir_xIn_5$," and the references cited therein, which are hereby incorporated by reference in their entirety). The ground state supercurrent generates a magnetic flux having a direction depending on the state of the supercurrent. The ground-state supercurrent or magnetic flux, being doubly degenerate, provides the basis for a qubit for quantum computing in accordance with an embodiment of the invention. Accordingly, the information contained in the qubit can be represented by this magnetic flux, and the magnetic flux can be measured, set, or influenced to read from, write to, or operate on the qubit. Additionally, qubits can be built in useful numbers in the solid state structures that support such time-reversal symmetry breaking ground state supercurrents.

Figure 1A:
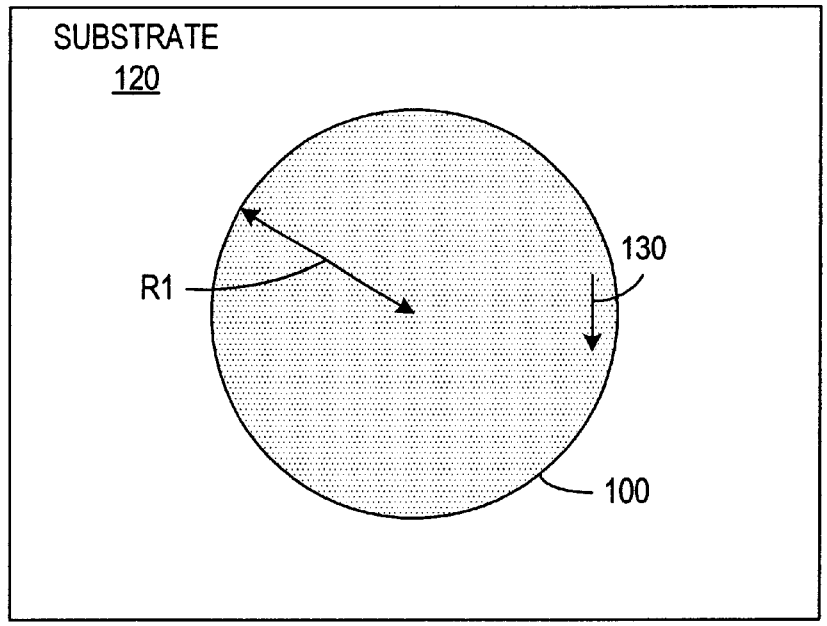
FIGS. 1A, 1B, 1C and 1D are plan views of island or dot qubits in accordance with an embodiment of the invention.
Figure 2A:
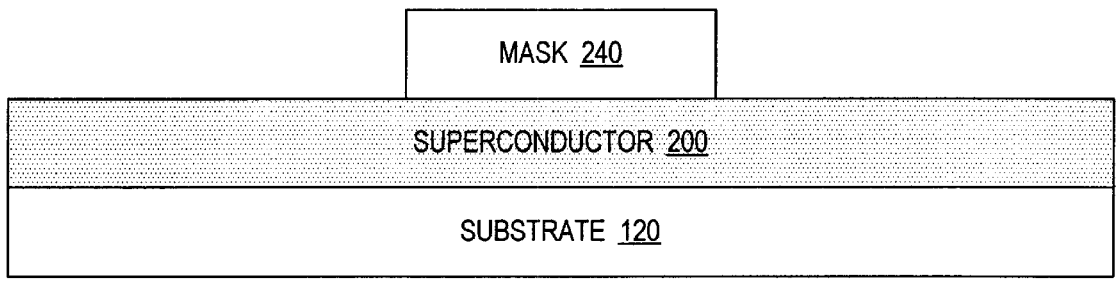
FIGS. 2A, 2B, and 2C are cross-sectional views of structures formed in a manufacturing process for a dot qubit in accordance with an embodiment of the invention.
Figure 2B:
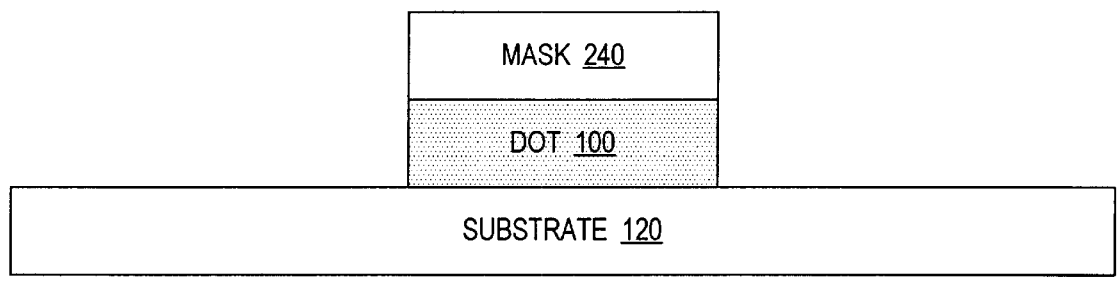
Figure 2C:
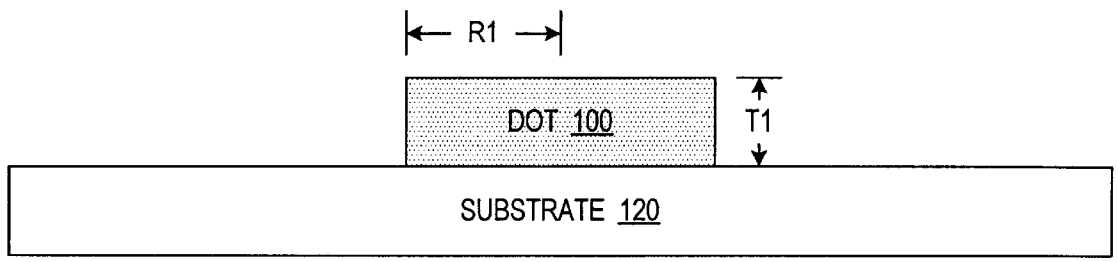

FIGS. 1A and 2C are respectively plan and cross-sectional views of superconductive dot 100 in accordance with exemplary embodiments of the invention. Dot 100 is a superconductive region overlying a substrate 120. The shape, size, and surroundings of dot 100 are generally chosen to minimize the capacitance of dot 100 with its surroundings. Generally, when the capacitance is minimized, the tunneling behavior of the dot will be optimized, and dot 100 will perform more reliably.

In operation, dot 100 is cooled to a temperature that makes the material in dot 100 is superconducting, typically below about 10° K for a d-wave superconducting material and below about 1° K for a p-wave superconducting material. The operating temperature is typically well below the superconducting transition temperature of dot 100 to minimize thermal interactions that could disturb the coherence of the quantum state of dot 100.

Dot 100 provides a basic block for construction of a qubit in a quantum computing device but can also be an independent device allowing demonstration of macroscopic quantum tunneling and incoherent quantum noise in a solid state system. As described further below, the macroscopic quantum tunneling in a set of independent islands permits construction of a random number generator that generates a random series with zero correlation.

Dot 100 may be formed of any superconductor having Cooper pairs in a state with non-zero orbital angular momentum. For example, this occurs in high-Tc cuprates such as $YBa_2Cu_3O_{7-x}$, where x takes on values between 0.0 and 0.6, or $Bi_2Sr_2Ca_{n-1}Cu_nO_{2n+4}$, $Tl_2Ba_2CuO_{6+x}$, or $HgBa_2CuO_4$. An example of a low temperature superconductor with non-zero angular momentum is $Sr_2RuO_4$, which has p-wave superconducting pairing symmetry of its order parameters. Another example of a p-wave superconductor is the heavy fermion material $CeIrIn_5$.

Substrate 120 is typically an insulator such as strontium titanate or sapphire on which a superconductor can be grown. In dot 100, a superconducting order parameter has a preferred direction 130 that is parallel to the plane of dot 100 and substrate 120. The persistent currents flow in the boundary between superconducting dot 100 and the ambient atmosphere surrounding dot 100.

It is advantageous to make the thickness T1 of dot 100 much less than the inplane dimension R1 (e.g., less than about 0.2 microns or approximately ⅒ of the diameter of the bounding area) so that the currents circulate predominantly in the plane of dot 100, creating magnetic moments that are normal to the plane, although this is not crucial. This allows easier access to the information stored in the qubit, facilitating single qubit operations.

Figure 1B:
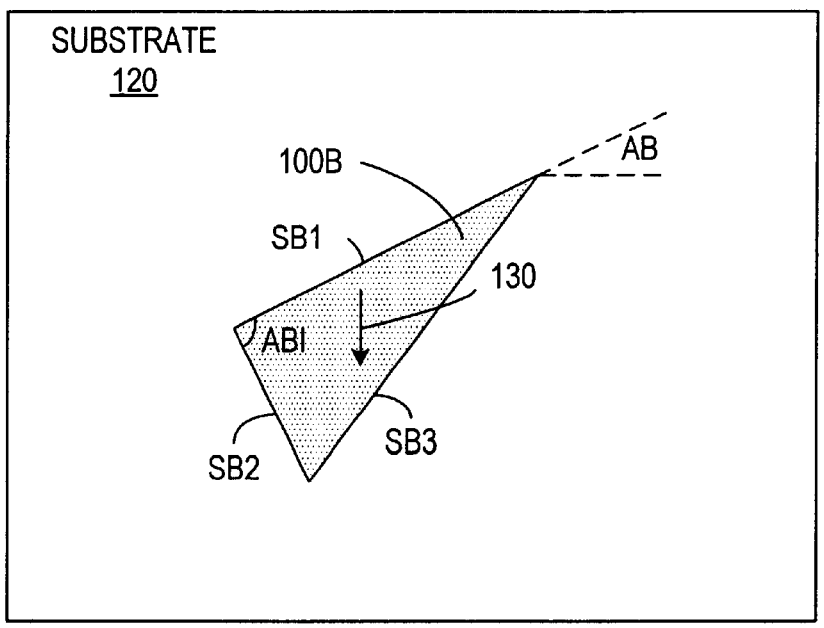

The persistent currents in the dot 100 are sensitive to the shape of dot 100. FIG. 1A shows dot 100 occupying a circular area, but a dot can occupy any closed area. FIG. 1B shows an embodiment of the invention where a dot 100B has a triangular shape. Triangular dot 100B may have any rotation angle AB relative to substrate 120 or direction 130 and any shape, e.g., any length sides SB1 and SB2 such that the triangle lies within bounding radius R1.

Figure 1C:
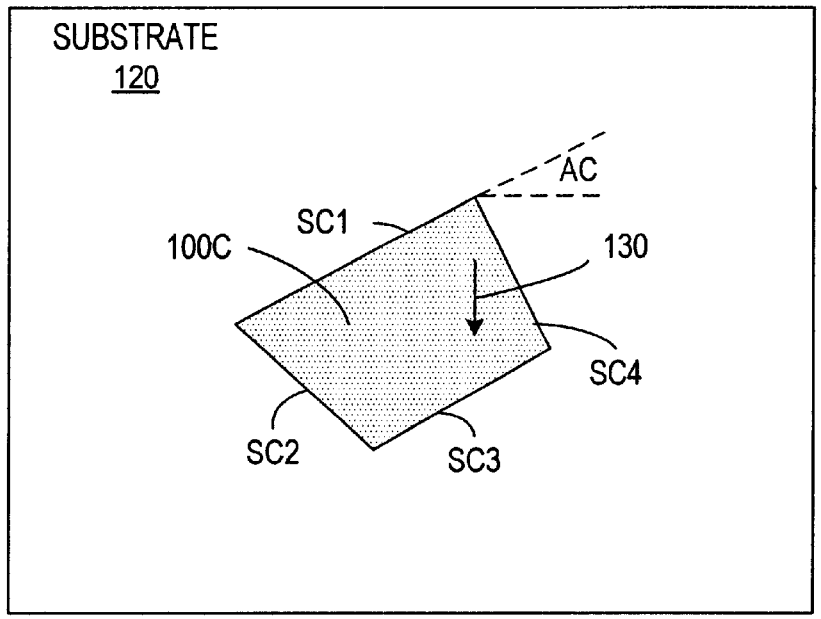

FIG. 1C shows an embodiment of the invention where dot 100C is polygonal in shape. This polygonal structure may have any shape, e.g., any lengths of sides SC1, SC2, SC3, and SC4, that lies within the bounding radius R1 and any rotation angle AC relative to substrate 120 or direction 130.

Figure 1D:
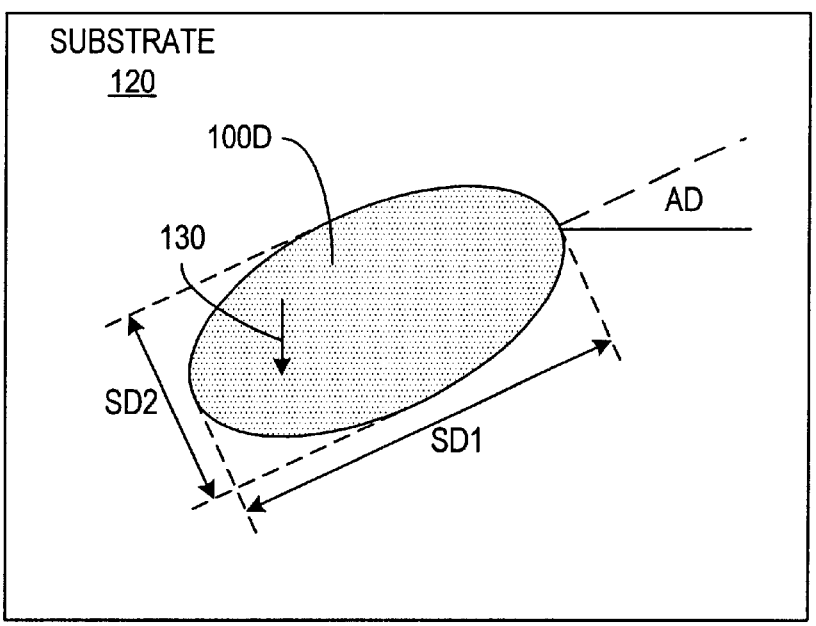

FIG. 1D shows an embodiment where a dot 100D is ellipsoidal in shape. This structure may have any shape, e.g., any semimajor axis SD1 and semiminor axis SD2, that lies within the bounding radius R1 and any rotation angle AD relative to substrate 120D or direction 130.

Although the shapes, sizes, and orientations of the dot qubits can vary widely, particular configurations may maximize the persistent ground state current or magnetic moment of the dot. In the high temperature, d-wave superconductor, the persistent current in triangular dot 100B is maximized when the internal angle ABI is 90° and the hypotenuse, SB3, is at a 45° angle with respect to the order parameter. Other optimal dot (or anti-dot) qubit configurations can be predicted using theories or models of superconductors and experimental verification.

Dot 100 (or dot 100B, 100C, or 100D) can be formed from a d-wave superconducting material using known techniques for processing high-Tc cuprates. See, for example, V. M. Krasnov, A. Yurgens, D. Winkler, P. Delsing, "Intrinsic Tunneling Spectroscopy In Small Bi2212 Mesas," Proc. Electron Transport in Mesoscopic Systems (Satellite conf. to LT22) Aug. 12–15, 1999, Goteborg, Sweden, P85, pp.231–232, and references therein, which are hereby incorporated by reference in their entirety. Similarly, dot 100 can be formed using known techniques for processing p-wave superconductive materials. See, for example, the methods described by I. Bonalde, B. D. Yanoff, M. B. Salamon, D. J. Van Harlingen, E. M. E. Chia, Z. Q. Mao, Y. Maeno, "Temperature Dependence of the Penetration Depth in $Sr_2RuO_4$: Evidence for Nodes in the Gap Function," Phys. Rev. Letters, Nov. 27, 2000, volume 85, number 22, and references therein, and also R. H. Heffner, D. E. MacLaughlin, J. E. Sonier, G. J. Nieuwenhuys, O. O. Bernal, Barbara Simovic, P. G. Pagliuso, J. L. Sarrao, and J. D. Thompson, "Time-Reversal-Symmetry Violation and Coexistence of Superconducting and Magnetic Order in $CeRh_{1-x}IrIn_5$," and the references cited therein, which are hereby incorporated by reference in their entirety.

FIGS. 2A, 2B, and 2C show cross-sections of structures illustrating an exemplary fabrication process for dot 100. The fabrication process begins by growing a film 200 of a high-Tc cuprate having thickness Ti about 0.2 microns on substrate 120. Substrate 120 may be formed of strontium titanate, sapphire, or any material upon which the superconductive thin film naturally grows. Such a film can be grown using pulsed laser deposition, which uses a laser beam to sputter the high-Tc cuprate onto substrate 120. Photolithographic processes, which are well known in the field of integrated circuit manufacturing, then form a mask 240, which may for example be formed of a photoresist material such as PMMA, on the high-Tc cuprate film 200.

An etching process removes a portion of film 200 to leave dot 100 (typically as one of several dots) on substrate 120 as shown in FIG. 2B. For dots 100 of the small size desired, the etching or patterning process can use an electron beam to remove part of the superconductor and leave dot 100 with the desired dimensions. For a description of some known processing techniques, see E. Il'ichev, V. Zakosarenko, R. P. J. IJsselsteijn, H. E. Hoenig, V. Schultze, H.-G. Meyer, M. Grajcar and R. Hlubina, "Anomalous Periodicity of the Current-Phase Relationship of Grain-Boundary Josephson Junctions in High-Tc Superconductors", Phys. Rev. B. 60 p.3096 (1999) and references therein, which are hereby incorporated by reference in their entirety. After etching, a solvent can remove mask 240, leaving dot 100 formed of superconductor 200 on substrate 120 (FIG. 2C).

Similarly, dot 100 (or dot 100B, 100C, or 100D) can be formed using known techniques for processing low-Tc, p-wave symmetry superconductors. For example, I. Bonalde, B. D. Yanoff, M. B. Salamon, D. J. Van Harlingen, E. M. E. Chia, Z. Q. Mao, Y. Maeno, "Temperature Dependence of the Penetration Depth in $Sr_2RuO_4$: Evidence for Nodes in the Gap Function," Phys. Rev. Letters, Nov. 27, 2000, volume 85, number 22, and references therein, which are hereby incorporated by reference in their entirety, describe fabrication methods using p-wave superconducting material.

In a second exemplary embodiment, a superconductor with dominant order parameter symmetry with non-zero angular momentum is locally damaged. This may be performed by partial etching or removal of a region of a superconductor film or damaging the region via particle irradiation, implantation or presence of an insulating phase in the material (such as the yttrium rich "green phase" in $YBa_2Cu_3O_{7-x}$). The non-superconductive region in an otherwise superconductive film is sometimes referred to herein as an anti-dot.

Figure 3A:
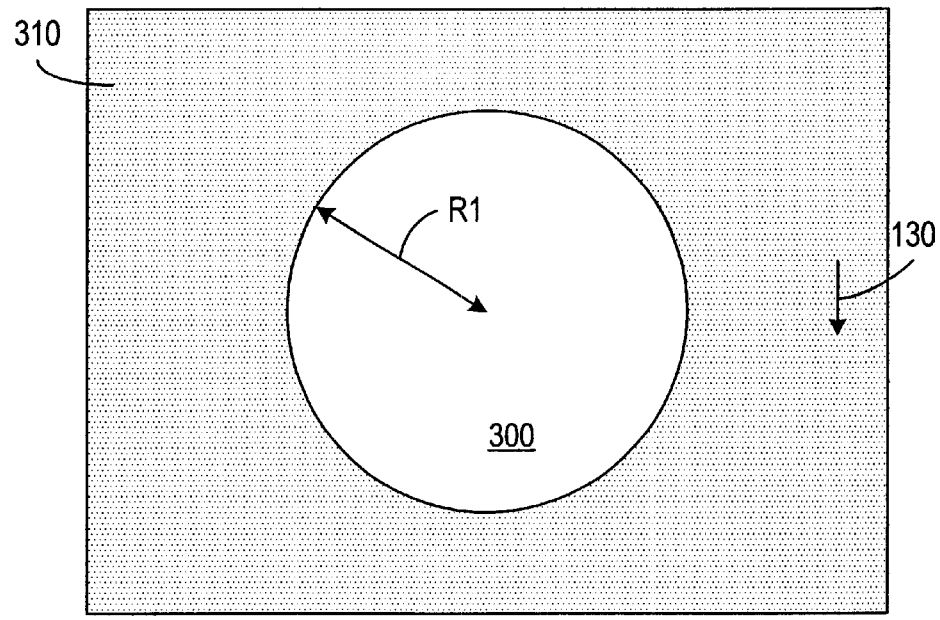
FIGS. 3A, 3B, 3C, and 3D are plan views of anti-dot qubits in accordance with an embodiment of the invention.

FIG. 3A shows a plan view of an anti-dot 300 in accordance with an embodiment of the invention. In FIG. 3A, anti-dot 300 is a locally damaged or removed region in a superconductive layer 310 and is bounded by a circle of radius R1, which is typically less than about 1.0 micron. Superconductive layer 310 can be formed on a substrate as described above. Also as above, the operating temperature of superconductive layer 310 is below approximately 10° K in a high-Tc embodiment and approximately 1° K in a low-Tc embodiment, to make layer 310 superconducting and suppress thermal disturbance of the quantum state of the anti-dot. The locally damaged region acts as a defect that suppresses the dominant order parameter locally, allowing time-reversal symmetry breaking that provides a degeneracy in the ground state supercurrent around anti-dot 300. These supercurrents circulate in a similar fashion to those around dot 100 described above, except that the insulator (be it the ambient atmosphere or a region of suppressed superconductivity) is now "inside" of a closed area and the superconductor is "outside", which is the inverse of the dot case.

Figure 3B:
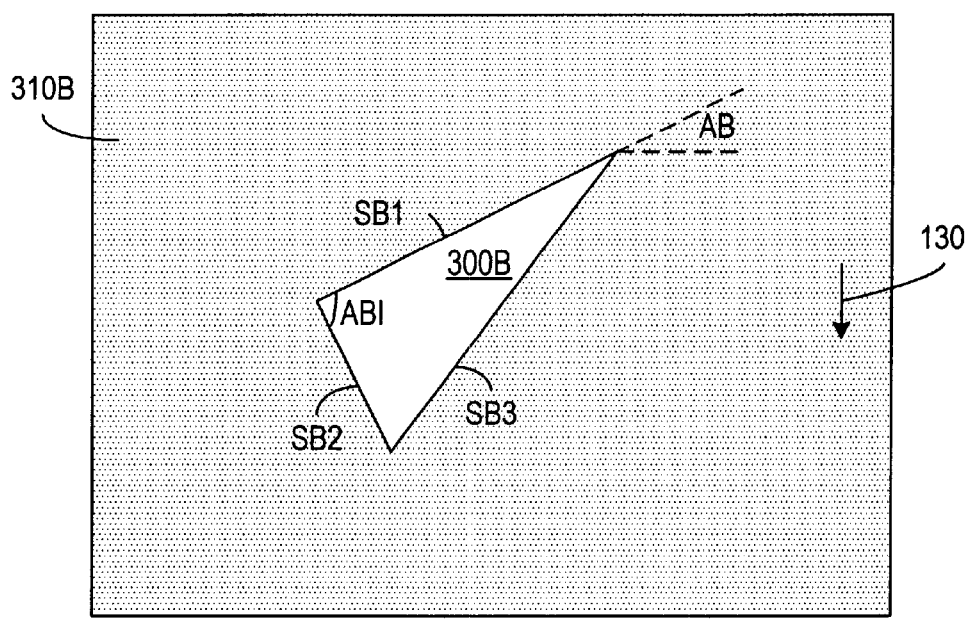
Figure 3C:
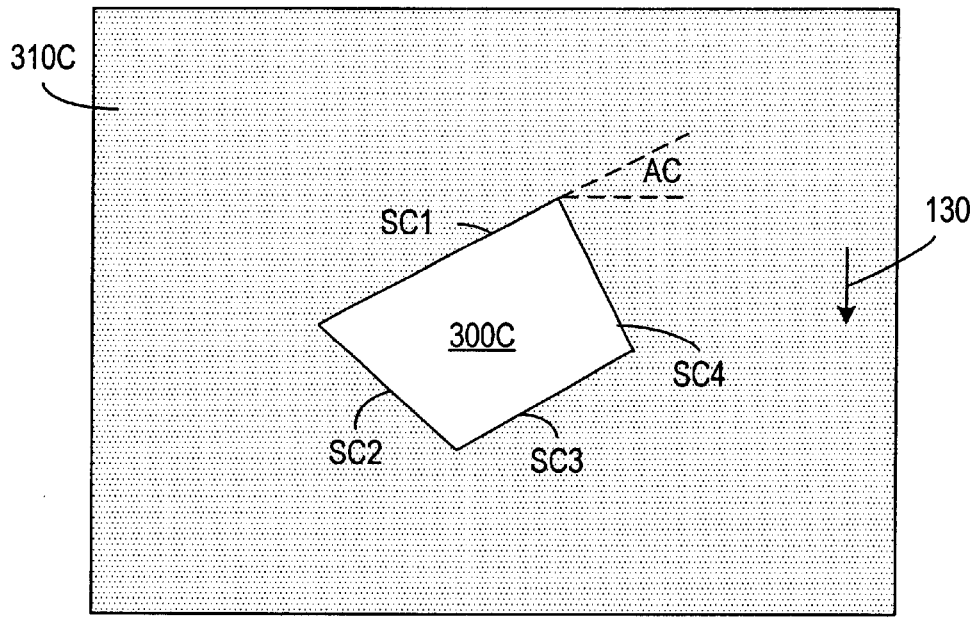
Figure 3D:
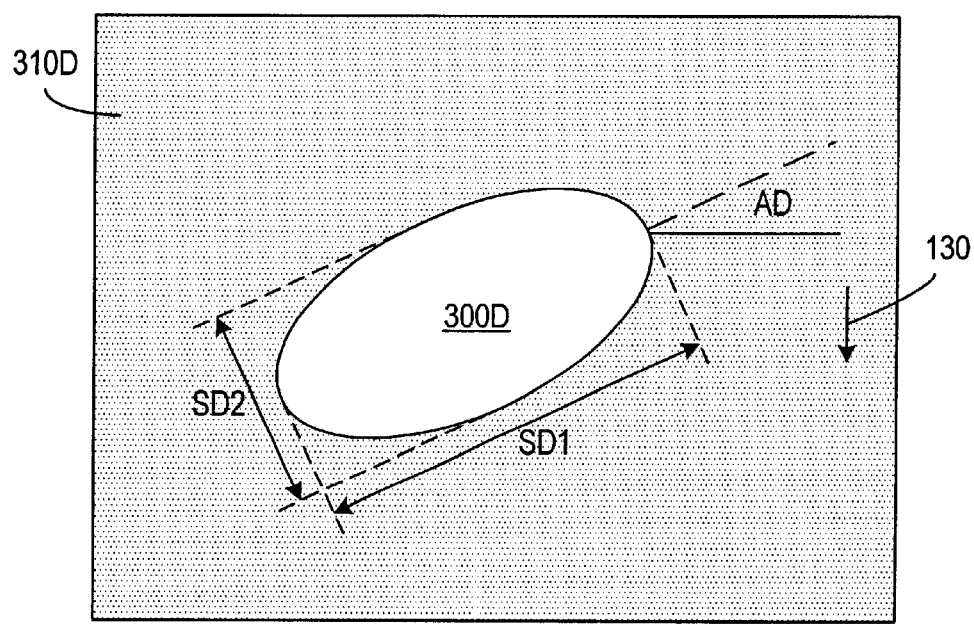

FIG. 3A shows an anti-dot that is circular, but other shapes can be employed. In particular, FIGS. 3B, 3C, and 3D respectively show embodiments where anti-dots 300B, 300C, and 300D are triangular, polygonal, and ellipsoidal in shape. The various shapes can have any rotation angle relative to the substrate or the direction 130. Sides or dimensions of the anti-dots can be varied within the limits of a bounding radius for the anti-dot. As in dot 100B, anti-dot 300B yields optimized persistent current when interior angle ABI is 90° and the hypotenuse, SB3, maintains a 45° angle with respect to the order parameter orientation 130.

Figure 4A:
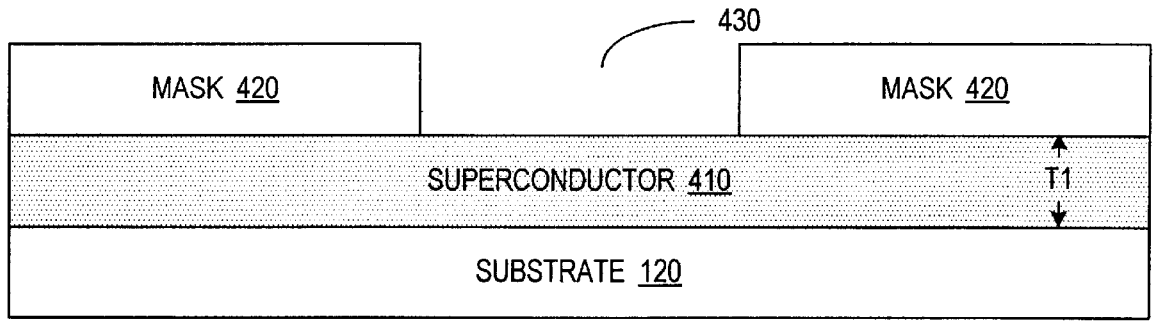
FIGS. 4A, 4B, and 4C are cross-sectional views of structures formed in a manufacturing process for an anti-dot qubit in accordance with an embodiment of the invention.
Figure 4B:
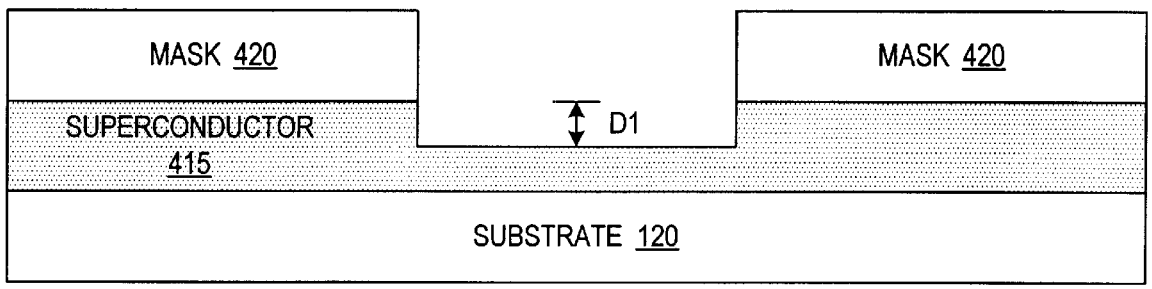
Figure 4C:
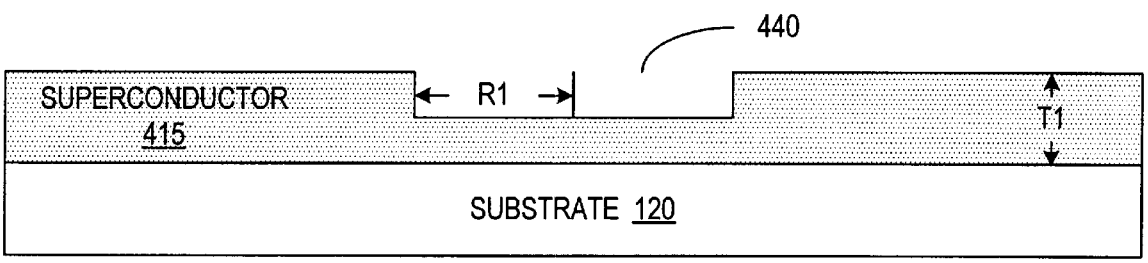

Anti-dot 300 can be formed using known techniques for construction of superconductive structures. FIGS. 4A, 4B, and 4C illustrate a first exemplary process for fabricating anti-dot 300. As shown in FIG. 4A, the fabrication process begins by growing a superconducting film 410 having thickness T1 less than about 1.0 microns on substrate 120. Substrate 120 may contain strontium titanate or any material upon which superconductive thin film 410 naturally grows. Film 410 can be grown using pulsed laser deposition, which uses a laser beam to sputter the high-Tc cuprate onto substrate 120. A photolithographic process deposits and patterns a mask 420 on superconductor 410 to form an opening 430 in mask 420.

As shown in FIG. 4B, an etching process removes portions of film 410 to form a film 415 having a depression or opening 440 in a region that mask 420 exposes. It is not necessary to etch the anti-dot all the way through film 410 to the substrate 120. In particular, the depth D1 of the etching into film 410 can be varied to fine tune the magnitude of the persistent currents. Typically, the etching depth D1 is about one half the initial thickness T1 of film 410. For anti-dot 300 of the small size desired, the etching or patterning process can use an electron beam to remove part of the superconductor film 410 and leave anti-dot 300 with the desired dimensions.

A second exemplary embodiment the fabrication process begins by growing a single crystal of a high-Tc cuprate having thickness, width and length all greater than one micron. Crystal growing procedures are well known and are described in, for example, A. Erb, E. Walker, and R. Flukiger, Physica C 245, 245 1995, and R. Liang, D. A.

Bonn, and W. N. Hardy, Physica C 304, 105 1998, and references cited therein, which are hereby incorporated by reference in their entirety. A photolithographic process masks and etches the crystal to form anti-dot 300 (typically as one of several anti-dots present in the same single crystal). Patterning and lithography of the crystals is similar to that for films.

Figure 5A:
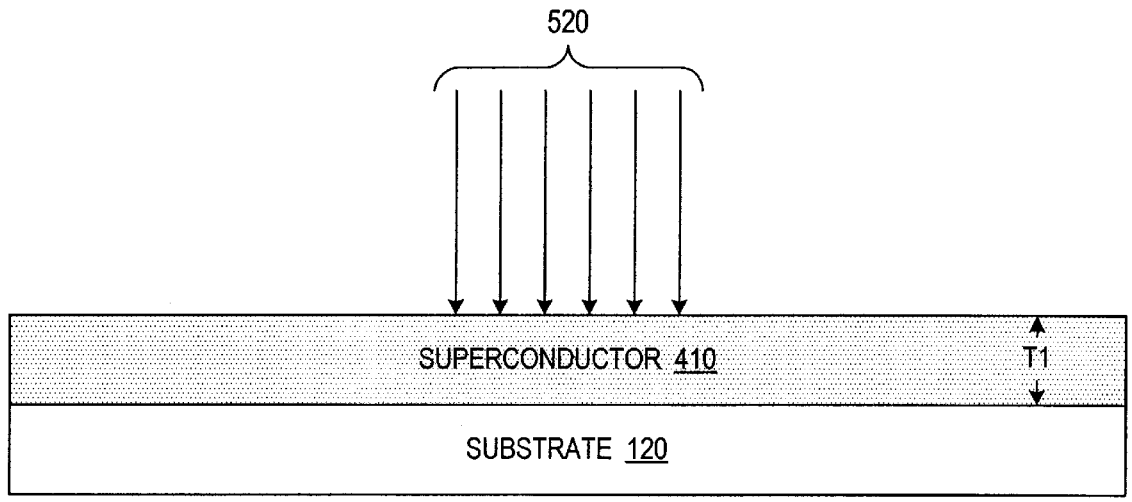
FIGS. 5A and 5B are cross-sectional views of structures formed in a manufacturing process using irradiation damage of a superconductor and form an anti-dot qubit in accordance with an embodiment of the invention.
Figure 5B:
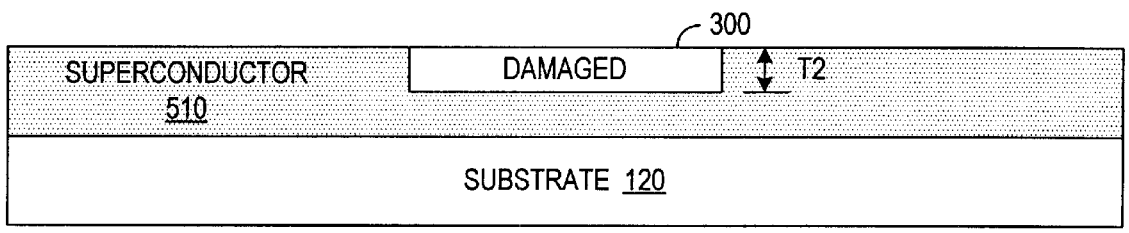

A third fabrication process begins by growing a film of a high-Tc cuprate 510 having thickness less than about 1.0 microns on substrate 120 as described above and illustrated in FIG. 5A. A particle beam 520 such as a beam of neutrons or alpha particles then irradiates the film, locally damaging a region of the film and forming anti-dot 300 (typically as one of several anti-dots) on substrate 120, as shown in FIG. 5B. Either a mask 420 as illustrated in FIG. 4A or the size of particle beam 520 can limit the anti-dot 300. FIG. 5A illustrates a process where the diameter of a particle beam limits the size of the anti-dot 300. Information on the effects of particle irradiation and methods to perform this irradiation are described, for example, in Mi-Ae Park and Yong-Jihn Kim "Weak Localization Effect in Superconductors by Radiation Damage" Phys. Rev. B 61, 14733 (2000) and references therein, which are hereby incorporated by reference in their entirety.

Figure 6:
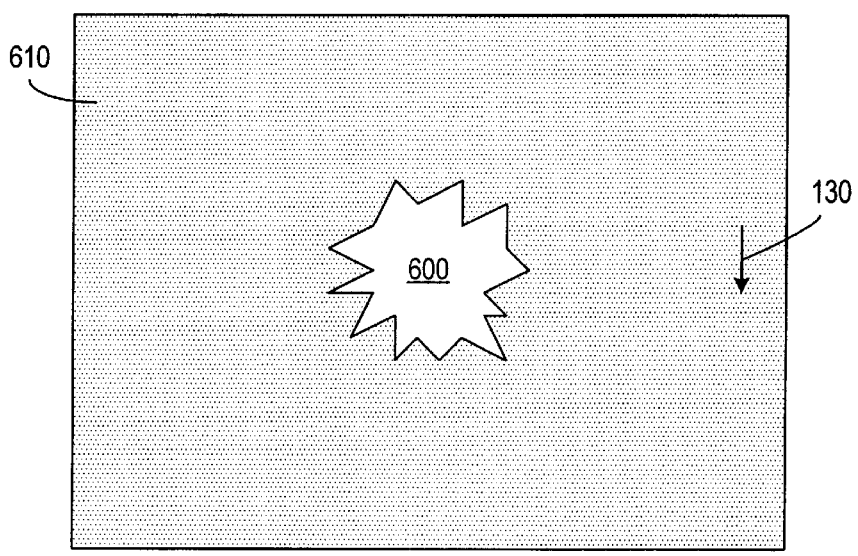
FIG. 6 is a plan view of an anti-dot qubit having an irregular shape formed by damaging the parent superconductor via particle irradiation in accordance with an embodiment of the invention.

The damaged region (i.e., the anti-dot) can have any of the shapes illustrated in FIGS. 3A, 3B, 3C, and 3D. The anti-dot can also have other shapes such as the irregular shape illustrated in FIG. 6, which may result when the size of the anti-dot nearly matches the size of the particle beam. Damage to the anti-dot does not need to extend all the way through film 510 to the substrate 120. The thickness T2 of the damage can be used to vary the magnitude of the persistent currents and typically extends to a depth that is about one half the thickness Ti of film 510. The resulting persistent current in this embodiment of the invention exhibits the same behavior as the anti-dots described above in regards to FIGS. 3A, 3B, 3C, and 3D.

A fourth fabrication process begins by growing a single crystal of a high-Tc cuprate having thickness, width and length all greater than about one micron. A source of particles is then used to irradiate the crystal, locally damaging it and forming an anti-dot (typically as one of several anti-dots fabricated on the crystal).

Figure 7A:
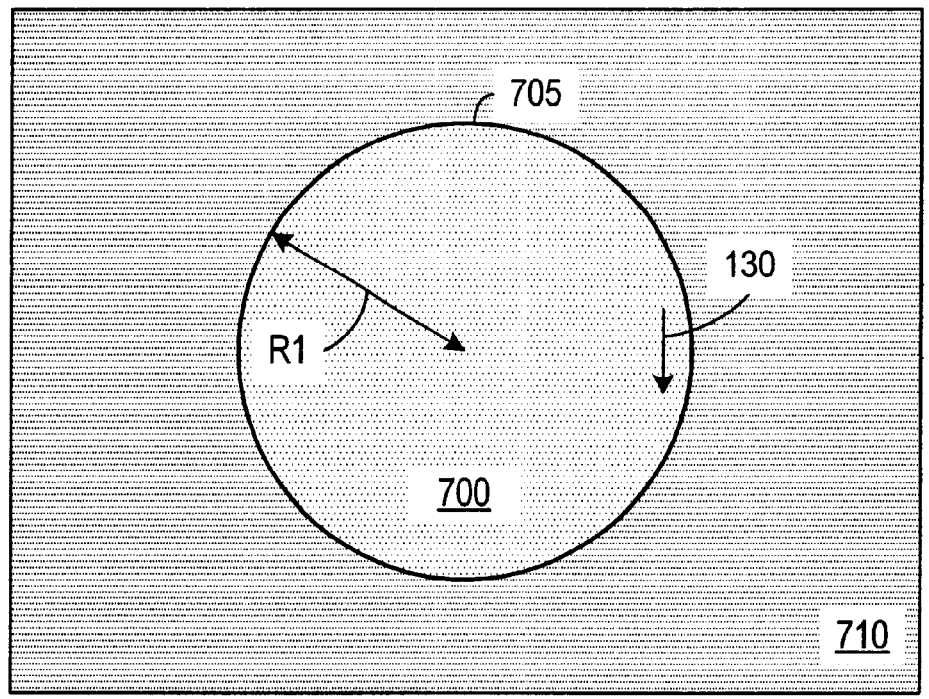
FIGS. 7A, 7B, 7C and 7D are plan views of a dot qubit formed in a surrounding insulator in accordance with an embodiment of the invention.
Figure 7B:
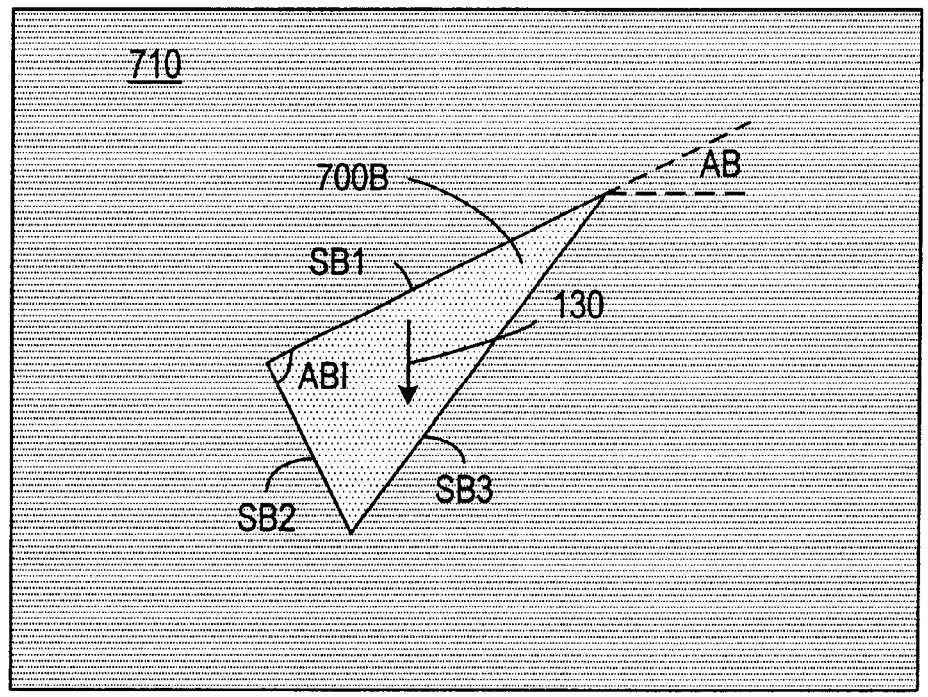
Figure 7C:
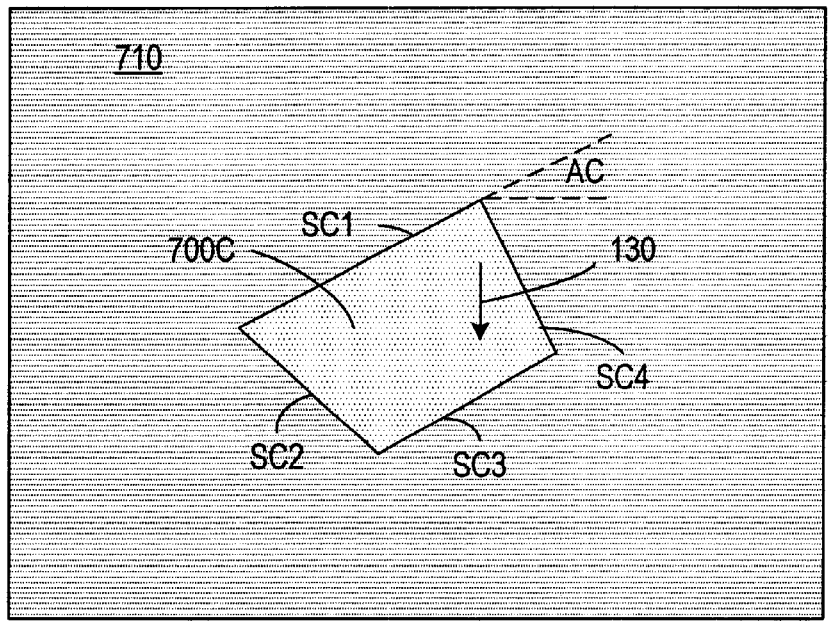
Figure 7D:
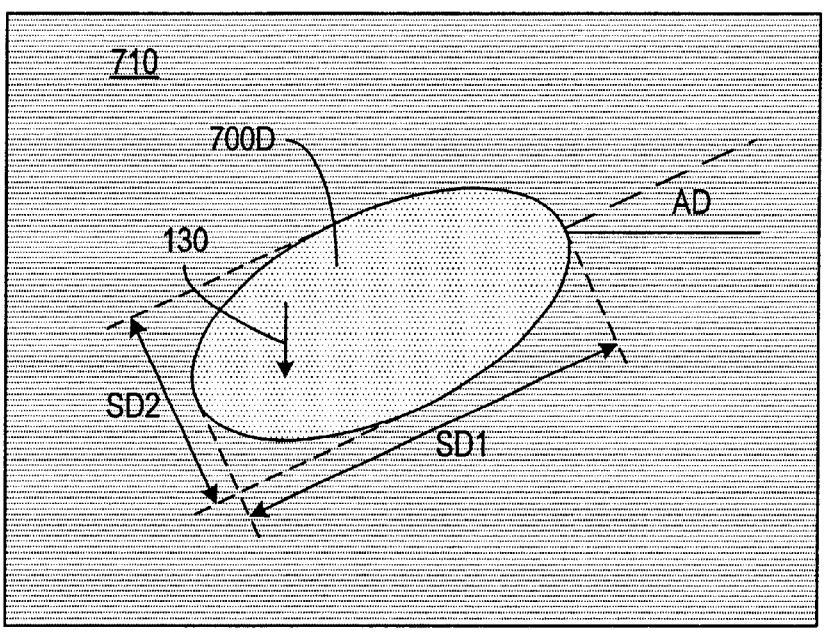

FIG. 7A illustrates a plan view of a dot 700 in accordance with yet another embodiment of the invention. This embodiment uses a layer 710 of a material that is an insulator but close to an insulating-superconducting transition and that photon or particle irradiation can cause a portion of layer 710 to transition into the superconducting phase. Local photon irradiation, for example, via scanning near-field microscopy techniques, can create dot 700 of superconductor inside the insulating matrix of layer 710. See, for example, R. S. Decca, H. D. Drew, E. Osquiguil, B. Maiorov, J. Guimpel, "Anomalous Proximity Effect in Underdoped YBaCuO Josephson Junctions," Phys. Rev. Lett. 85, 3708 (2000) and references therein, which are hereby incorporated by reference in their entirety. The bounding radius R1 of dot 700 is preferably less than about 1 micron. Dot 700 then functions in a similar fashion to dot 100 of FIG. 1A, except that a boundary 705 along which the supercurrent flows is a superconductor-parent insulator boundary instead of a superconductor-ambient atmosphere boundary.

Dot 700 is not limited to being circular in shape but instead can have any desired shape as illustrated in FIGS. 7A, 7B, 7C, and 7D. In particular, dot 700 can be circular, elliptical, triangular, or polygonal, with certain non-trivial shapes resulting in maximized persistent current. For example, a triangular shape (as illustrated similarly by dot 100B and anti-dot 300B) yields maximal persistent current when the internal angle ABI is 90° and the hypotenuse, SB3, maintains a 45° angle with respect to the order parameter of the superconductive material.

Figure 8A:
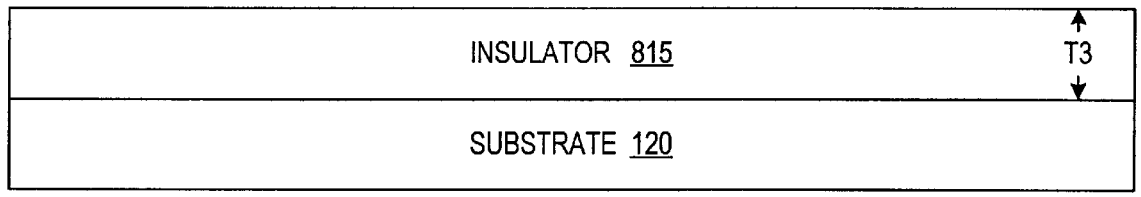
FIGS. 8A and 8B are cross-sectional views of structures formed in a manufacturing process for a qubit in accordance with an embodiment of the invention.
Figure 8B:
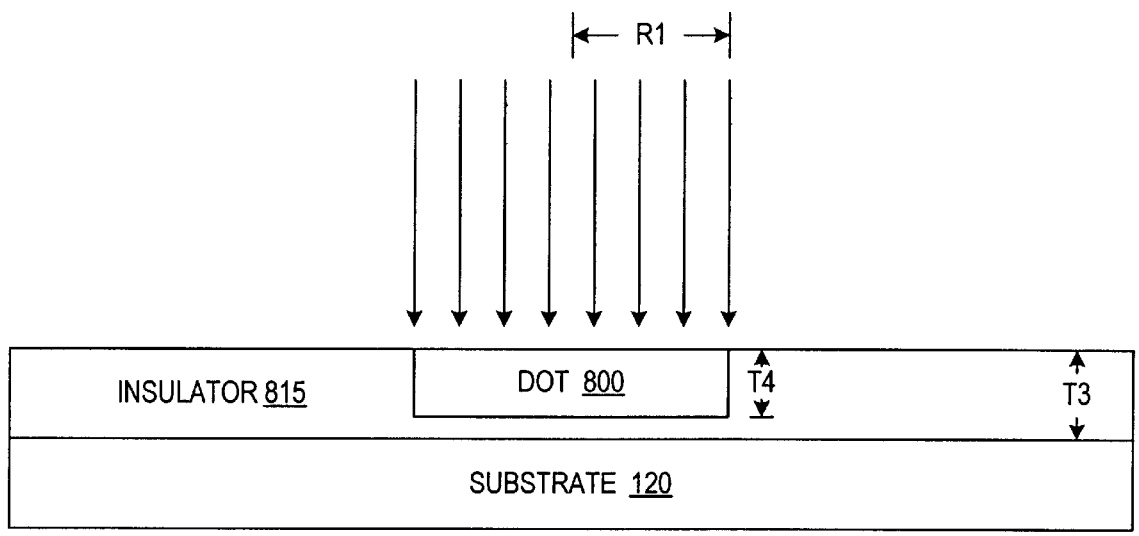

FIG. 8A illustrates a first fabrication process for dot 700, which begins by growing a film 815 of an under-doped insulating high-Tc cuprate (such as $YBa_2Cu_3O_{7-x}$, where x is strictly greater than 0.6 and strictly less than 1.0) having a thickness T3 of about 0.2 microns on substrate 120. Substrate 120 may be formed of any material upon which the under-doped, insulating high-Tc film naturally grows, such as strontium titanate. Such a film can be grown using pulsed laser deposition, which uses a laser beam to sputter the cuprate onto substrate 120.

A photon source or a particle beam source then irradiates a region of film 815, which forms superconductive dot 800 (typically as one of several dots) within the parent insulating film 815. The irradiation changes the local charge density, effectively changing the doping of the high-Tc cuprate so that the region can become superconducting. The effect of the irradiation is known to persist over an extended period unless the material is heated.

The thickness T4 of dot 800 can be varied so as to control the magnitude of the persistent supercurrents generated around dot 800. Thickness T4 of dot 800 is preferably about one half the thickness T3 of layer 815.

For operation, any of the above-described embodiments of the invention are cooled to a temperature less than about 10° K in a high-Tc superconductor embodiment, or 1° K in a low-Tc superconductor embodiment, so that all relevant regions are superconducting. To suppress thermal sources of decoherence, the operating temperature is far below the threshold temperature Tc for superconductivity of the superconductors. In particular, the low temperature suppresses decoherence processes due to inelastic scattering.

For all embodiments of the invention, the order parameter symmetry of the superconductor causes a non-zero supercurrent in the ground state, and the ground state of the supercurrent is twice degenerate if no external electromagnetic field is applied. Two degenerate states having the ground state energy and distinct magnetic moments correspond to ground state supercurrents circulating around the boundary of the dot or anti-dot in clockwise and counter-clockwise senses, in a preferred plane of the dot and/or anti-dot. In accordance with current theoretical descriptions, e.g., the Eilenberger equations describing the quasi-classical limit of superconductivity, an order parameter $\Psi$ describes supercurrents in superconductors. See for example M. H. S. Amin, A. N. Omelyanchouk, and A. M. Zagoskin, "Mechanisms of Spontaneous Current Generation in an Inhomogeneous d-Wave Superconductor," LANL preprint server cond-mat/001 1416, submitted to Phys. Rev. B, Feb. 8, 2001 and references therein, which are hereby incorporated by reference in their entirety. The two basis states ($|0>$ and $|1>$) associated with the supercurrent in all embodiments of the invention permit quantum computing as described further below.

To write to the qubit (initialize its state), a static magnetic field with a magnitude selected according to the specific embodiment of the invention, is applied normal to the plane of the qubit and in a direction chosen according to the desired basis state ($|0>$ or $|1>$). The magnetic field has the effect of biasing or breaking the degeneracy of the qubit states. With this bias, the qubit decays to the most energetically favorable state (either |0> or |1> as required), with the time to decay typically being shorter than 1 millisecond but depending on the chosen embodiment of the invention. See U. Weiss, Quantum Dissipative Systems, World Scientific, 1998, which is hereby incorporated by reference in its entirety.

To perform single qubit operations on the dot or anti-dot qubit, the external magnetic field can be modulated. Application of a magnetic field in the plane of the qubit generates a term in the effective Hamiltonian of the form $\Delta(H_x)\hat{\sigma}_x$, where the tunneling matrix element $\Delta(H_x)$ between the states |0> and |1> can be varied over a large range, typically from zero (for zero transverse field) to 100 GHz depending on the specific embodiment of the qubit. Applying a magnetic field normal to the plane of the qubit provides a term proportional to $\hat{\sigma}_z$.

To overcome the effects of tunneling and keep a dot or anti-dot qubit in a specific state, an alternating magnetic field B(t) normal to the qubit can be used. This has the effect of adding to the Hamiltonian a term proportional to $B(t)\hat{\sigma}_z$, where, for example, B(t) can be a square wave. This method is also used in conjunction with a clock whose frequency is an integer multiple of the square wave frequency (so that at every clock pulse the qubit is in the same state it began in).

To read the supercurrent state associated with a dot or anti-dot, an ultra-sensitive instrument, such as a SQUID microscope, a scanning Hall probe, or magnetic force microscope (particularly a magnetic force cantilever microscope), determines the direction of the magnetic flux and thereby reads the state of the qubit.

Figure 9A:
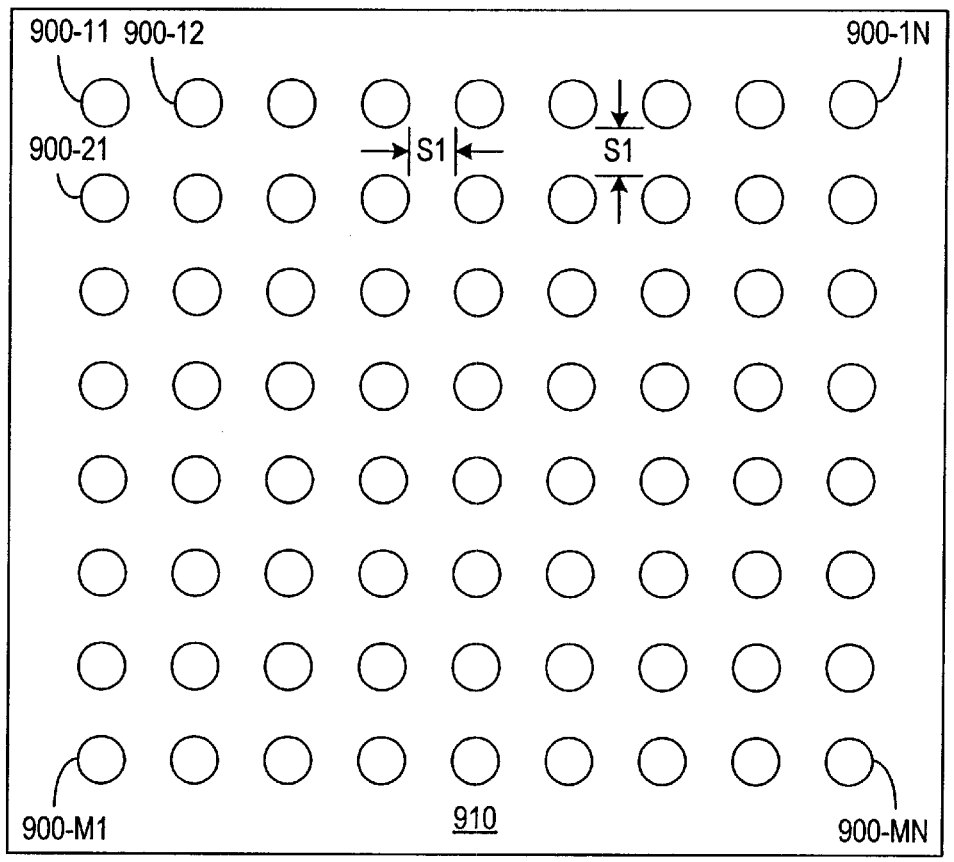
FIGS. 9A and 9B are respectively plan and perspective views of a quantum computing device containing an array of dot or anti-dot qubits in accordance with an embodiment of the present invention.
Figure 9B:
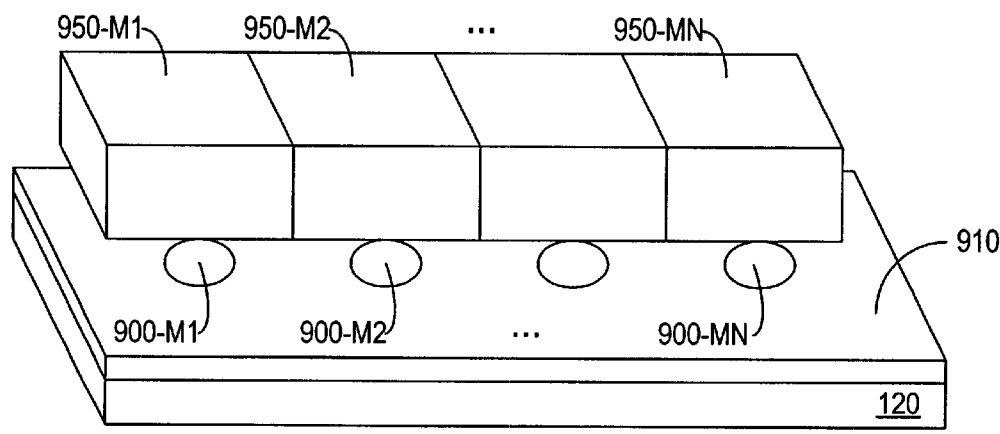

FIGS. 9A and 9B illustrate a quantum computing device in accordance with an embodiment of the invention. The quantum computing device includes dot or anti-dot qubits 900-11 to 900-MN, which are arranged in an M by N planar array formed in a surrounding material 910 on a substrate 120. Each qubit 900 can be a dot or anti-dot according to any of the above-disclosed embodiments of the invention. The horizontal and vertical separations S1 between the outer edges of the bounding radii of nearest-neighbor qubits is not vital but should be greater than 1 micron to reduce coupling between adjacent qubits. Qubits 900 can operate at a temperature below about 4.2° K in a high-Tc embodiment or 1° K in a low-Tc p-wave embodiment, so that thermal excitations do not interfere with the coherence of the quantum state associated with the supercurrent. Each qubit 900-11 to 900-MN has an associated input/output (I/O) device 950-11 to 950-MN for data input and output.

For data input, devices 950-11 to 950-MN generate magnetic fields normal to the plane of respective qubits 900-11 to 900-MN (longitudinal fields) and in the plane of respective qubits 900-11 to 900-MN (transverse fields). In one embodiment, I/O devices 950-11 to 950-MN include conventional magnetic circuits that apply magnetic fields to individual qubits or groups of qubits. The magnetic fields break the degeneracy of the ground state current and allow each qubit 900-11 to 900-MN to settle in a quantum state corresponding to a known superposition of the clockwise and counterclockwise supercurrent states.

After initializing the qubits, the magnetic fields are removed or changed, and subsequent quantum tunneling between the ground states, in the presence of applied magnetic fields, describes the evolution of the state of the qubit. The effect of these magnetic fields on the evolution of the qubit is known and is described in, for example, G. Rose, "AC Relaxation in the $Fe_8$ Molecular Magnet," Chapters 4&5, Ph.D. Thesis, University of British Columbia, Department of Physics and Astronomy.

For data output, I/O devices 950-11 to 950-MN can include devices such as a SQUID microscope or a magnetic force microscope that measures supercurrent of each qubit when a quantum calculation is complete.

In the embodiment of FIG. 9B, I/O devices 950-11 to 950-MN can be formed as an array of SQUIDs formed on a substrate that is "flip-chip" bonded to substrate 120. The array of SQUIDs has a pitch that matches that of the array or qubits. Ideally, the same SQUID acts as both an input device that applies magnetic fields to a corresponding qubit and as an output device that senses the magnetic moment of the supercurrent in the corresponding qubit. Niobium SQUID, which are known in the art, could be employed. Alternatively, an array of aluminum or high-Tc SQUIDs should also be suitable.

One application of the invention is as a fundamental building block for gates and circuits for performing computations involving quantum information.

Another application of the invention is in a random number generator. In this application, the quantum states of a set of qubits evolve to a state where each qubit has an equal (or at least known) probability of being in each of ground states. The states are then determined, for example, by observing each qubit with a magnetic force microscope or another magnetic probe. Each determined state corresponds to a bit value (0 or 1) so that the collection of determined states provides a random binary value having as many bits as there are qubits in the set. Quantum theory indicates that a series of bits thus generated are random without correlation or repetition.

The time required for a calculation and the interpretation of the read out results depends on the calculation performed. Such issues are the subjects of many papers on quantum computing. The structures described herein can perform calculations requiring only single qubits provided that the structures provide a sufficient number of independent qubits and a decoherence time that is longer than the required calculation time. The structures can typically achieve longer coherence times by decreasing the operating temperature.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A quantum computing device comprising:
   an interface between a first area and a second area, wherein the interface follows a perimeter of a closed area, and one of the areas is a superconductive material having Cooper pairs that are in a state with non-zero orbital angular momentum; and
   a sensor operable to sense a persistent current along the interface around the closed area.

2. The quantum computing device of claim 1, further comprising a device capable of applying localized magnetic fields both parallel and perpendicular to a plane of the interface.

3. The quantum computing device of claim 2, wherein applying the localized magnetic field perpendicular to the plane of the interface writes a value to the qubit.

4. The quantum computing device of claim 1, wherein the sensor is capable of applying localized magnetic fields both parallel and perpendicular to the plane of the interface.

5. The quantum computing device of claim 1, wherein the closed area is inside a bounding area having a radius less than one micron.

6. The quantum computing device of claim 1, wherein the superconductive material is a d-wave superconductor.

7. The quantum computing device of claim 6, wherein the superconductive material is selected of the group consisting of $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$.

8. The quantum computing device of claim 1, wherein the superconductive material is a p-wave superconductor.

9. The quantum computing device of claim 8, wherein the superconductive material is $Sr_2RuO_4$.

10. The quantum computing device of claim 8, wherein the superconductive material is $CeIrIn_5$.

11. The quantum computing device of claim 1, wherein the second material is a non-superconductive material.

12. The device of claim 11, wherein the superconductive material comprises a layer having openings in which the non-superconductive material resides.

13. The device of claim 12, wherein one or more of the openings pass completely through the layer.

14. The device of claim 11, wherein the superconductive material comprises a layer having one or more depressions in which the non-superconductive material resides.

15. The device of claim 11, wherein the non-superconductive material is an insulating material.

16. The device of claim 11, wherein the interface comprises:

a first region of the superconductive material in the closed area; and a second region of the non-superconductive material, wherein the second region surrounds the first region.

17. The device of claim 11, wherein the interface comprises:

a first region of the non-superconductive material in the closed area; and a second region of the superconductive material, wherein the second region surrounds the first region.

18. The device of claim 11, wherein the interface comprises:

a first region of the superconductive material in the closed area; and a second region of ambient atmosphere, wherein the second region surrounds the first region.

19. The device of claim 11, wherein the interface comprises:

a first region of ambient atmosphere in the closed area; and a second region of superconductive material, wherein the second region surrounds the first region.

20. The device of claim 11, wherein the first and second materials are the same except that one of the first and second materials is irradiated to change its properties.

21. The device of claim 1, wherein the first and second materials are the same except that the second material has a damaged crystalline structure.

22. The device of claim 1, wherein the sensor comprises a scanning SQUID microscope.

23. The device of claim 1, wherein the sensor comprises a magnetic force cantilever microscope.

24. The device of claim 1, wherein the sensor comprises a scanning Hall probe.

* * * * *